(12) United States Patent
Little et al.

(10) Patent No.: US 7,413,468 B1
(45) Date of Patent: Aug. 19, 2008

(54) CONNECTOR ASSEMBLY PROVIDED WITH LED

(75) Inventors: Terrance F. Little, York, PA (US);
Kevin E. Walker, Hershey, PA (US);
Stephen Sedio, Valley Center, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/001,686

(22) Filed: Dec. 12, 2007

(51) Int. Cl.
*H01R 3/00* (2006.01)
(52) U.S. Cl. ..................................... 439/490
(58) Field of Classification Search .............. 439/676, 439/490, 56, 65
See application file for complete search history.

(56) References Cited

U.S. PATENT DOCUMENTS

| | | | |
|---|---|---|---|
| 4,324,451 A * | 4/1982 | Ammon et al. ............ 439/637 |
| 4,969,824 A * | 11/1990 | Casciotti ...................... 439/62 |
| 5,876,239 A | 3/1999 | Morin et al. |
| 5,885,100 A * | 3/1999 | Talend et al. ................ 439/490 |
| 6,113,422 A | 9/2000 | Somerville et al. |
| 6,428,361 B1 * | 8/2002 | Imschweiler et al. ........ 439/676 |
| 6,508,675 B1 * | 1/2003 | Korsunsky et al. .......... 439/637 |
| 6,554,638 B1 * | 4/2003 | Hess et al. ................... 439/490 |
| 6,736,647 B1 * | 5/2004 | Gillenberg ................... 439/65 |
| 6,962,511 B2 | 11/2005 | Gutierrez |

* cited by examiner

*Primary Examiner*—Tho D Ta
(74) *Attorney, Agent, or Firm*—Wei Te Chung

(57) ABSTRACT

A connector assembly (100) adapted for being mounted to a circuit board, includes a jack member, a contact module (5) defining a number of recesses (54), a substrate (6), a number of LEDs (40) disposed on the substrate and inserted into the recesses of the contact module, and an upper conduit module (41) engaged with the jack member and inserted into a corresponding recess of the contact module and aligned with a corresponding LED for transmitting light produced from the LED.

16 Claims, 5 Drawing Sheets

CONNECTOR ASSEMBLY PROVIDED WITH LED

BACKGROUND OF THE INVENTION

1. Field of the Invention

The present invention relates to a connector assembly, and particularly to a modular jack connector assembly provided with a Light Emitting Diode (LED), used in various electronic devices.

2. Description of Related Art

A connector assembly provided with a LED is disclosed in U.S. Pat. No. 6,962,511, which was issued on Nov. 8, 2005. The connector assembly comprises a plurality of connector groups each having a pair of opposite daughter boards, a terminal module disposed between the pair of daughter boards, and a frame mounted at a rear portion of the connector group. The frame has a pair of light carriers formed at an upper portion thereof, a pair of LEDs fixed within the light carriers, and a pair of conduits connected to the light carriers and extending forwardly above the daughter board to transmit outwardly the light produced from the LED.

The connector assembly has an excessive dimension not only in height for extension of the conduits but also in length for allowing the light carrier together with the LED disposed at the rear portion thereof.

Additionally, the LEDs are fixed in a predetermined position of the frame so that the manufacture of the connector assembly is complicated. Furthermore, the LEDs could not be easily configured to work under different requirements.

U.S. Pat. No. 6,113,422 (the '422 patent) issued on Sep. 5, 2000 discloses a connector assembly having a pair of LEDs positioned on a base member and a pair of conduits mounted to a connector housing and aligned with corresponding LEDs to transmit light produced from the LEDs. The base member to be mounted on a substrate has a plurality of signal conditioning elements formed thereon.

U.S. Pat. No. 5,876,239 (the '239 patent) issued on Mar. 2, 1999 discloses a connector assembly having a pair of LEDs exposed on a base member and a pair of conduits located above corresponding LEDs to transmit light produced from the LEDs. The conduits are fixed in the insulative housing and extending along an upper portion and a rear portion of the connector assembly.

The LEDs disclosed in '422 and '239 patents are disposed above the base member and the conduits are mounted in the connector assembly only via the engagement between the conduits and the insulative housing. The conduits might not be fixed to the connector assembly firmly. Therefore, it is hard to achieve an exact and reliable alignment between the conduits and the LEDs.

Hence, an improved connector assembly is required to overcome the above-mentioned disadvantages of the related art.

SUMMARY OF THE INVENTION

An object of the present invention is to provide a connector assembly provided with a LED allowing maximum space efficiency.

Another object of the present invention is to provide a connector assembly capable of preferably conducting desired LEDs in a versatile manner that is not fixed at a predetermined position.

Another object of the present invention is to provide a connector assembly capable of achieving a reliable engagement between the LEDs and the conduits.

Another object of the present invention is to provide a connector assembly having a conduit fixed thereto firmly.

To achieve the aforementioned objects, a connector assembly adapted for being mounted to a circuit board comprises a jack member, a contact module defining a plurality of recesses, a substrate, a plurality of LEDs disposed on the substrate and inserted into the recesses of the contact module, and an upper conduit module extending along a side of the jack member and inserted into a corresponding recess of the contact module and aligned with a corresponding LED. The substrate defines a plurality of mounting holes and a plurality of conductive circuits electrically connected with the mounting holes and corresponding LEDs. The mounting holes are preferably insertable of pins in electrical communication with corresponding LEDs and the circuit board. The conduits are mounted on both the daughter board and the insulative housing.

The upper conduit extends along the side of the jack member and would not occupy a space defined to the rear of the jack member. Therefore, the connector assembly has optimal space usage and the space taken by itself has been reduced.

Additionally, no matter on which position of the substrate the LEDs are mounted, the LEDs could be electrically connected to the circuit board via the electrical connection among the LED, the conductive circuit, the pins and the circuit board. Therefore there is no need to fix the LEDs at a predetermined position of the substrate. LEDs could also be easily configured to work via the appropriate insertion of pins, relative to a specified footprint.

The LEDs mounted on the substrate and inserted into the recesses of the contact module would ease the disposition of the LEDs and insure the engagement between the LED and a corresponding conduit since both of them are confined in a same recess.

The conduits could be fixed to the connector assembly firmly since the conduits are mounted on both the daughter board and the insulative housing.

Other objects, advantages and novel features of the invention will become more apparent from the following detailed description of a preferred embodiment when taken in conjunction with the accompanying drawings.

DETAILED DESCRIPTION OF THE INVENTION

Figure 1:
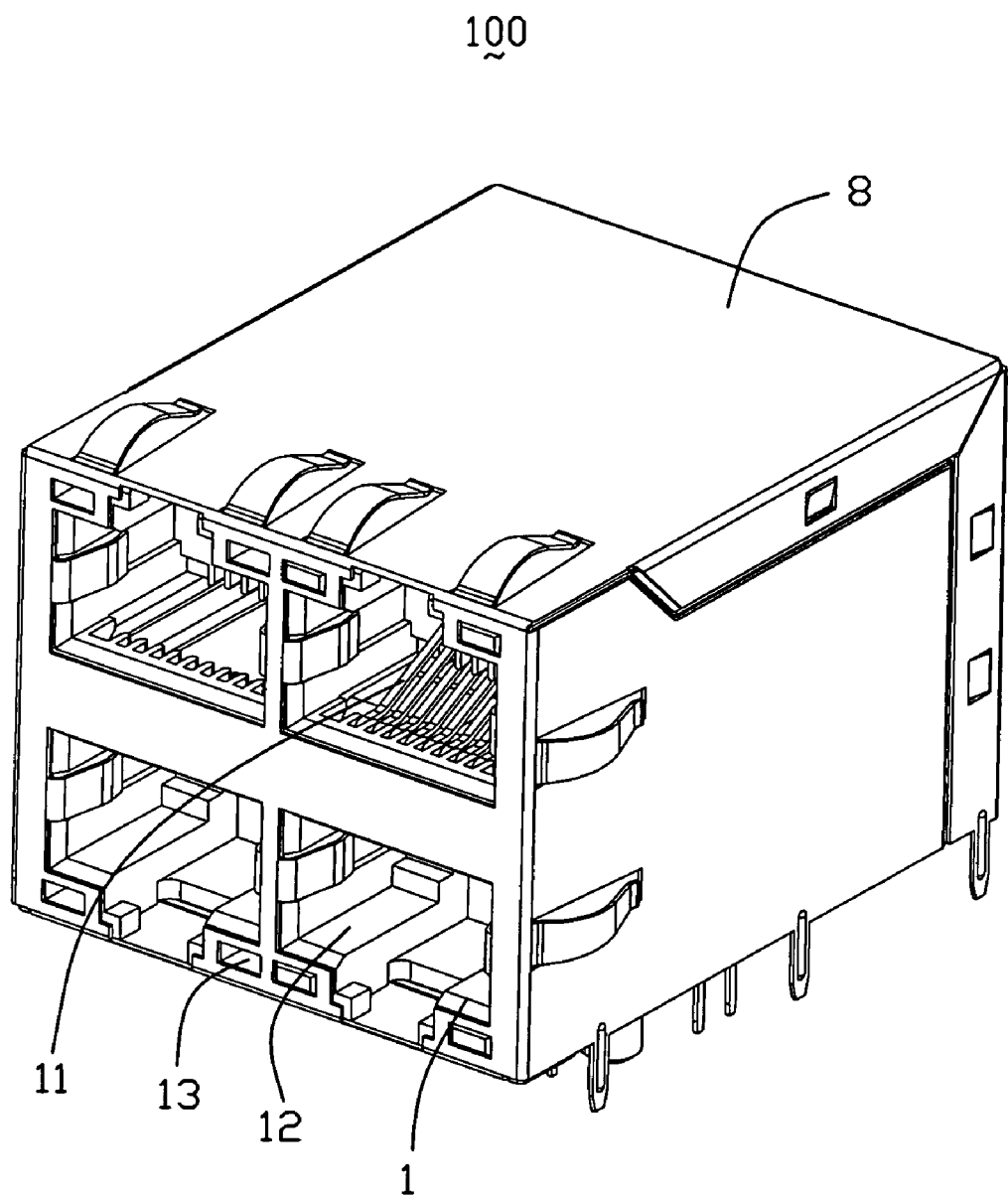
FIG. 1 is an assembled perspective view of a connector assembly in accordance with the present invention.
Figure 2:
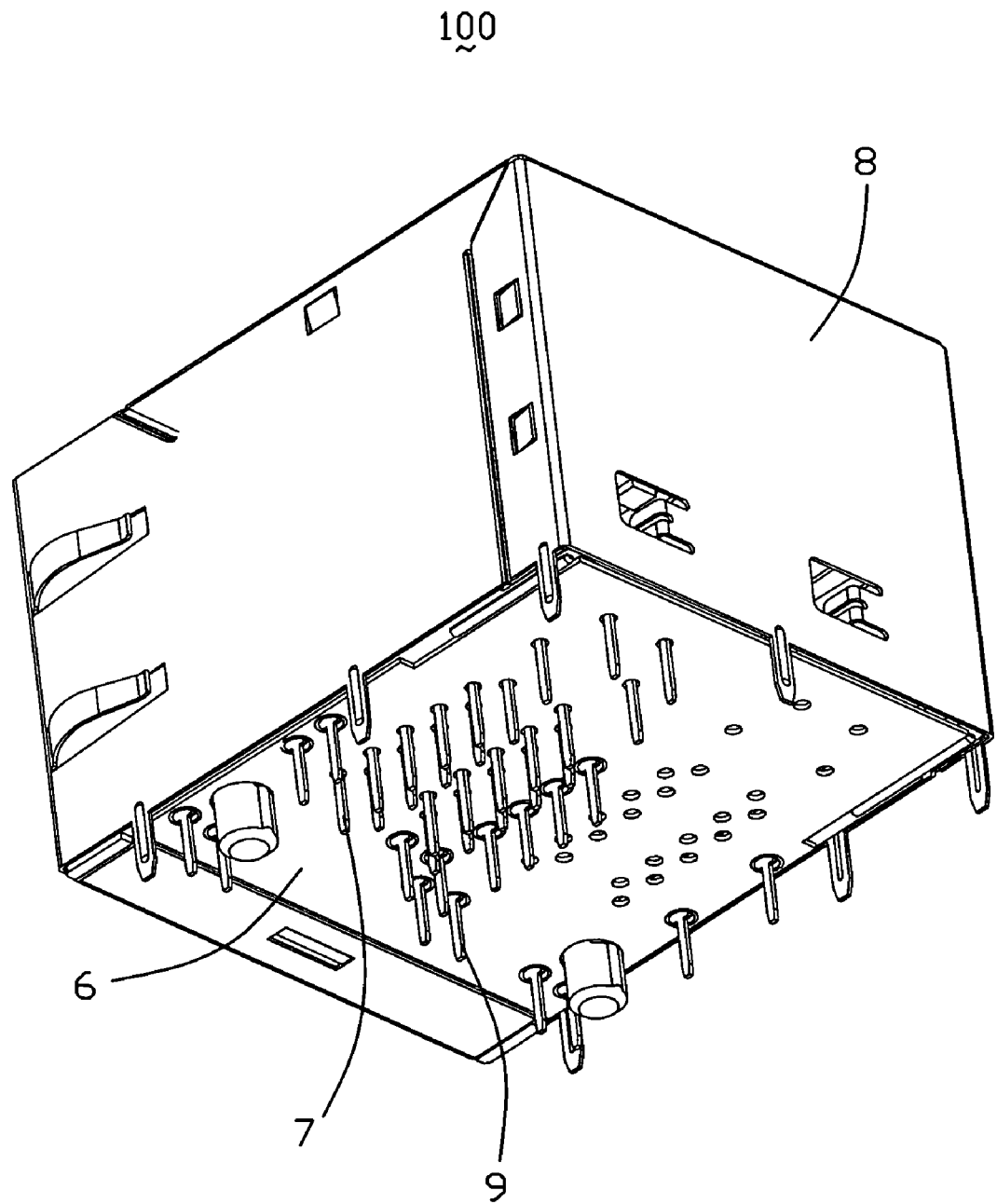
FIG. 2 is an assembled perspective view similar to FIG. 1, taken from another aspect.

Reference will now be made to the drawing figures to describe the present invention in detail. Referring to FIGS. 1-4, a connector assembly 100 in accordance with the preferred embodiment of the present invention is adapted for being electrically connected to a circuit board (not shown). The connector assembly 100 comprises an insulative housing 1, a plurality of terminal modules 2, a vertical daughter board 3 disposed between adjacent two terminal modules 2, a contact module 5 mounted below the daughter board 3, a substrate 6 attached to a lower portion of the contact module 5, a plurality of LEDs 40 mounted on an upper surface of the substrate 6, an upper conduit module 41 assembled to the contact module 5, a pair of lower conduits 42 mounted in the insulative housing 1, and a shielding shell 8 attached to the insulative housing 1. The terminal modules 2 and the daughter board 3 could be regarded as a jack member (not labeled).

Referring to FIG. 1, the insulative housing 1 is substantially rectangular and has a plurality of upper ports 11 and a plurality of lower ports 12 symmetrically arranged in upper and lower rows. The upper and lower ports 11, 12 respectively have a pair of openings 13 defined at upper and lower portions thereof.

Figure 3:
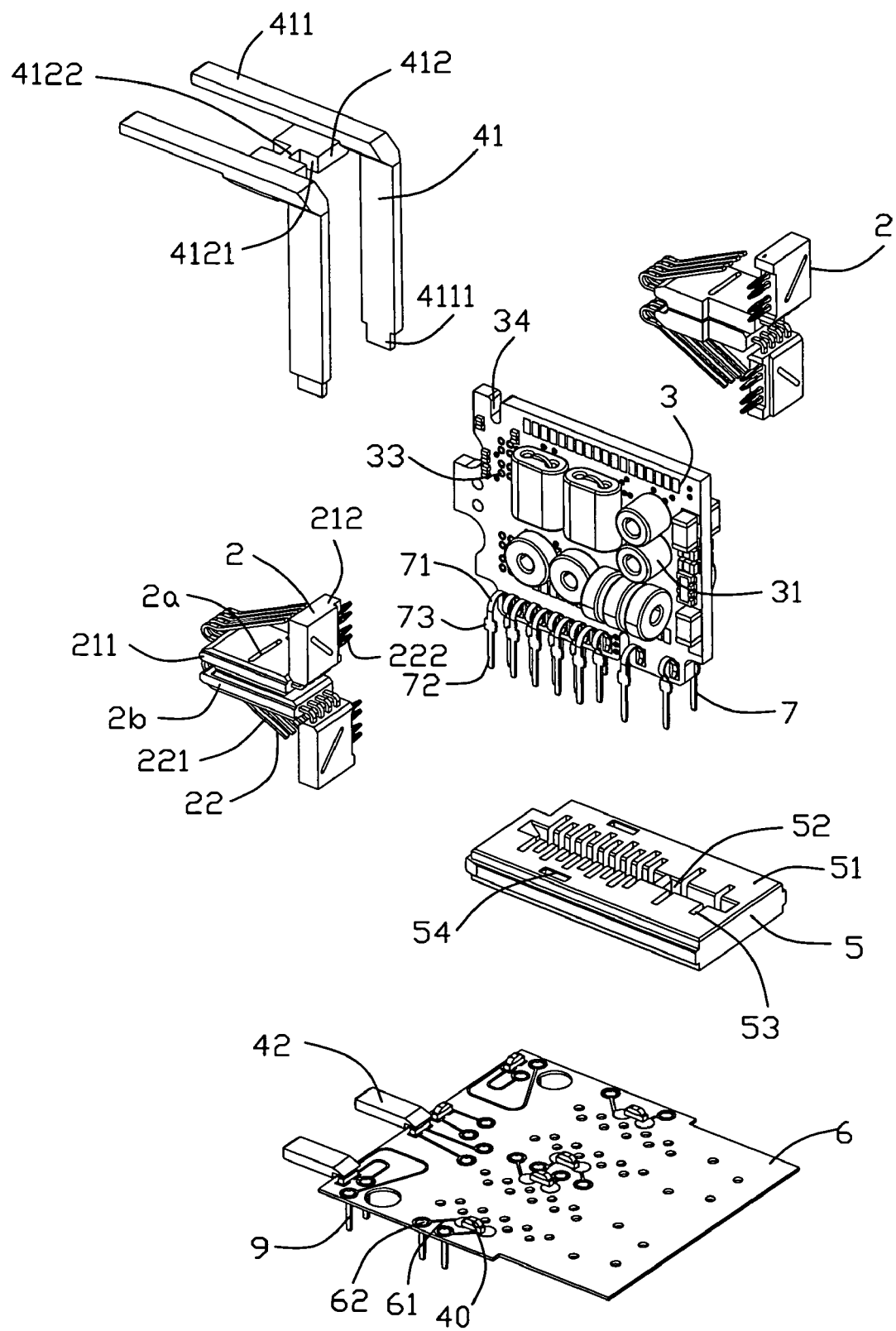
FIG. 3 is an exploded perspective view of the connector assembly as shown in FIG. 1, with an insulative housing and a shielding shell being removed.

Referring to FIG. 3, each terminal module 2 comprises an upper terminal module 2a and a lower terminal module 2b respectively having a plurality of mating terminals 22, a first plate 211 and a second plate 212 perpendicular to the first plate 211. Each mating terminal 22 comprises a horizontal portion (not shown) embedded in the first plate 211, a contacting portion 221 bending backwardly from a front end of the horizontal portion, an upstanding portion (not shown) perpendicular to the horizontal portion and embedded in the second plate 212, and a tail portion 222 perpendicular to the upstanding portion for connecting with the daughter board 3.

Figure 4:
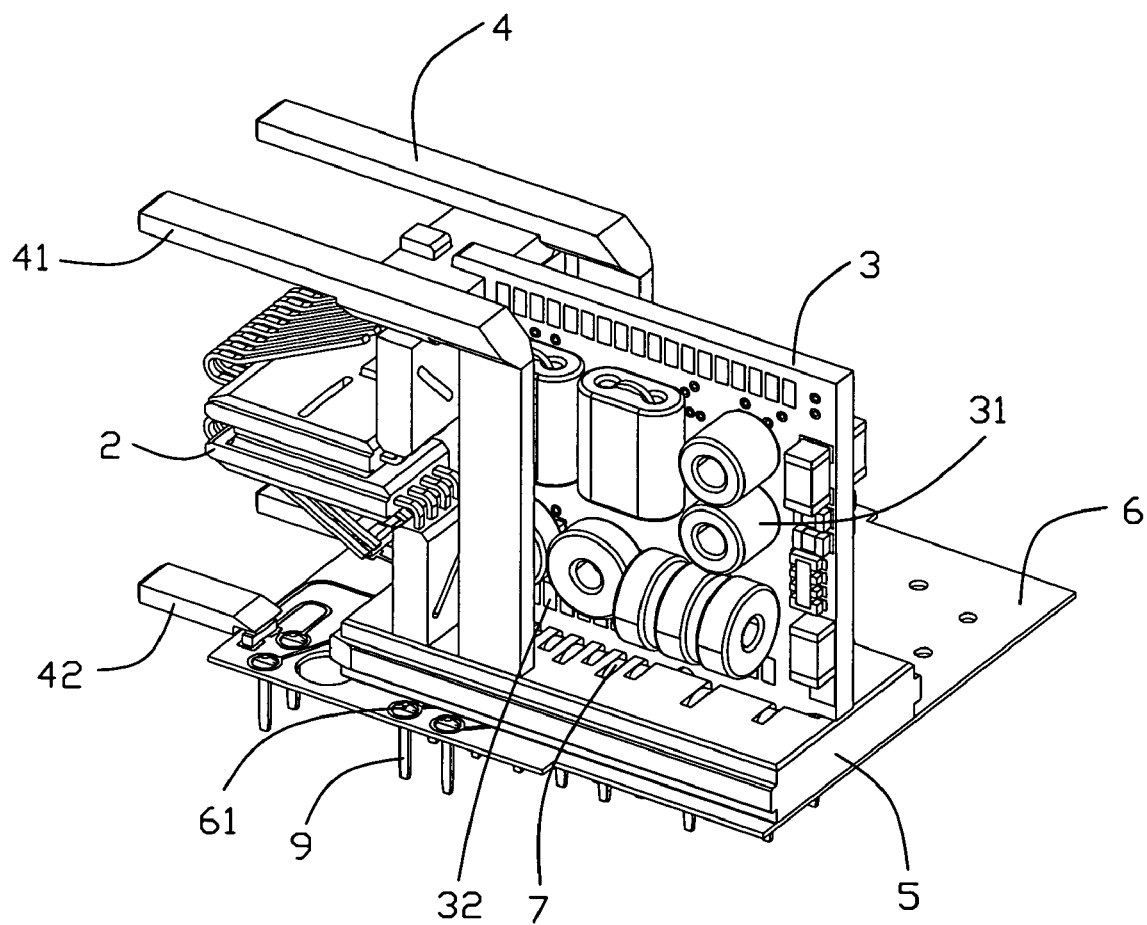
FIG. 4 is a partially assembled perspective view of the connector assembly, with the insulative housing and the shielding shell being removed.

In conjunction with FIG. 4, the daughter board 3 has a pair of opposite side faces each having a plurality of electronic elements 31 formed thereon, a cutout 34 defined at an upper edge thereof, two rows of pinholes 33 defined along a front edge thereof and a plurality of conductive pads 32 provided along a lower edge thereof.

The contact module 5 comprises a substantially rectangular body portion 51 and a plurality of connecting terminals 7 inserted in the body portion 51. The body portion 51 has a longitudinal extending insertion slot 52, a plurality of transversely extending passageways 53 arranged along regular intervals along the length of the insertion slot 52 and communicating with the insertion slot 52. The insertion slot 52 together with the passageways 53 are configured as a fishbone shape. The body portion 51 has a pair of symmetrical recesses 54 extending therethrough.

Each connecting terminal 7 has an inverted U-shaped contacting end 71 and a press fit portion 72 extending downwardly from the contacting end 71 and a plurality of laterally projecting barb portions 73.

The upper conduit module 41 comprises a pair of L-shaped upper conduits 411 each having an insertion portion 4111 formed at a lower end thereof, and a connecting beam 412 formed between upper portions of the pair of upper conduits 411. The connecting beam 412 defines a pair of opposite indentations 412 to form an engaging portion 4122 therebetween. The connecting beam 412 could be removed from the upper conduit module 41 to separate the upper conduits 411 into two pieces, if only the upper conduits 411 could be fixed on the contact module 5.

The substrate 6 has a plurality of LEDs 40 provided thereon, a plurality of mounting holes 61 defined thereon, and a plurality of conductive circuits 62 electrically connecting with the mounting holes 61 and corresponding LEDs 40.

Referring to FIGS. 1-4, in assembly of the connector assembly 100, the contact module 5 is perpendicularly mounted to a bottom of the daughter board 3, with the insertion slot 52 insertion of the lower portion of the daughter board 3 together with the conductive pads 32. The pair of terminal modules 2 are respectively assembled to front portions of opposite side faces of the daughter board 3, with the tail portions 222 of the upper and lower terminal modules 2a, 2b respectively inserted into two rows of the pinholes 33 defined on the daughter board 3. The connecting terminals 7 are inserted in the passageways 53 of the contact module 5, with the contacting ends 71 bending toward the daughter board 3 for contacting with corresponding conductive pads 32, the barb portions 73 having an interference with the passageways 53 and the press fit portions 72 extending downwardly throughout the contact module 5.

The upper conduit module 41 is assembled to opposite sides of the daughter board 3, with the engaging portion 4122 engaging with the cutout 34 of the daughter board 3 and the insertion portions 4111 inserted in the recesses 54 of the contact module 5 in a top-to-bottom direction.

In conjunction with FIG. 1, the terminal modules 2, the daughter board 3, the upper conduit module 41 and the contact module 5 together with the connecting terminals 7 are retained within the insulative housing 1. The upper and lower terminal modules 2a, 2b are respectively received in the upper and lower ports 11, 12 for mating with a mating plug (not shown). The front ends of the upper conduits 411 are exposed from the openings 13 of the upper ports 11. The lower conduits 42 are inserted in the openings 13 of the lower ports 12.

The substrate 6 is attached to a lower portion of the contact module 5, with the LEDs 40 provided at a front portion thereof aligned with the lower conduits 42, and the LEDs 40 positioned at a rear portion thereof inserted into the recesses 54 in a bottom-to-top direction for aligning with the insertion portions 4111 of the upper conduits 411. The press fit portions 72 of the connecting terminals 7 insert throughout the substrate 6 for electrically connecting with the circuit board. Finally, the shielding shell 8 is attached to an outer face of the insulative housing 1 for shielding purpose.

In use, when the connector assembly 100 is connected to the circuit board, an electrical connection among the mating terminals 2, the daughter board 3, the connecting terminals 7 and the circuit board has been established. At the same time, a plurality of detachable pins 9 are preferably inserted into corresponding mounting holes 61. Upper end of the pin 9 is electrically connected to the conductive circuit thereby to corresponding LEDs, and lower end of the pin 9 is electrically connected to the circuit board. An electrical connection between preferred LEDs 40 and the circuit board is established. The preferred LEDs 40 when illuminated, produce light which is transmitted outwardly through the upper and lower conduits 411, 42.

Figure 5:
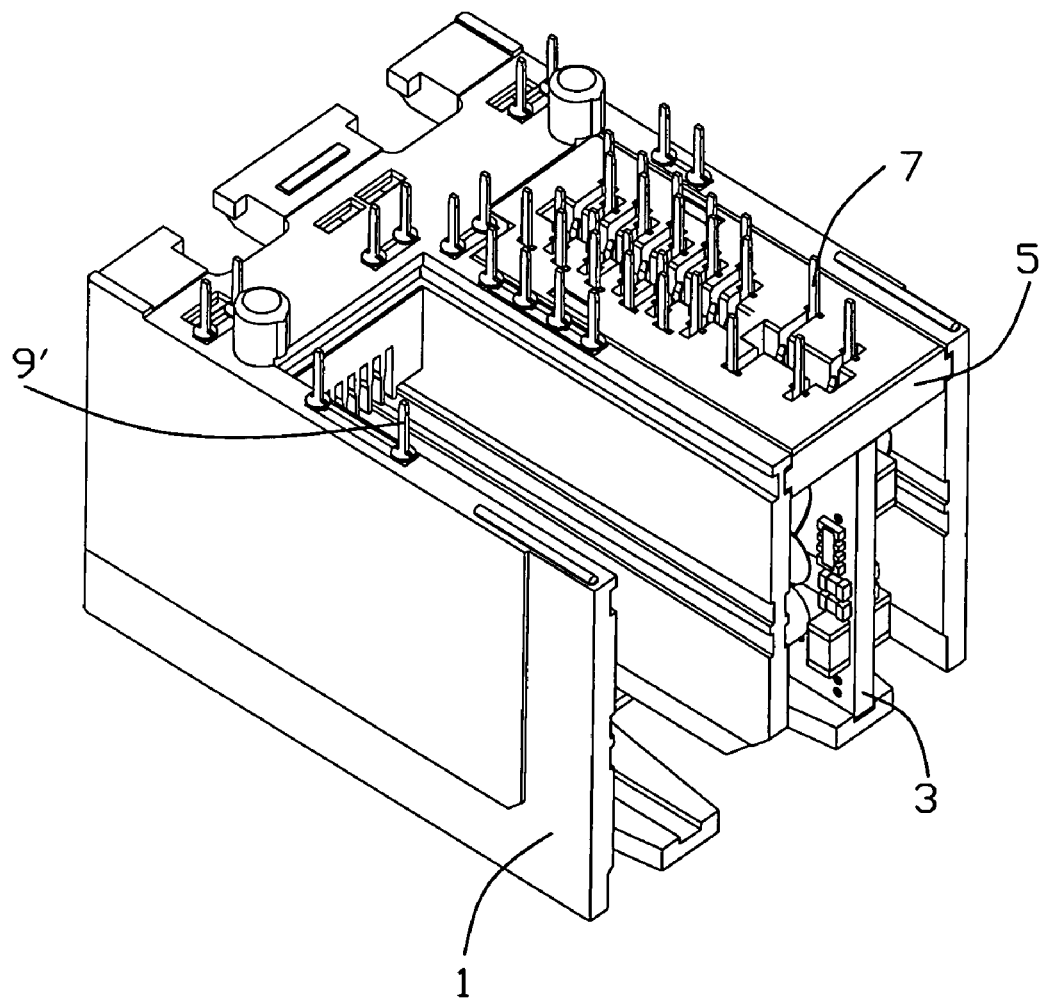
FIG. 5 is a partially assembled perspective view showing a daughter board and a contact module being assembled to an insulative housing preferred in a second embodiment.

Referring to FIG. 5, in a second embodiment, the insulative housing 1 has a plurality of floating pins 9' stitched therein. Each floating pin 9' inserts through the mounting hole 61 of the substrate 6 and engaging with a corresponding footprint (not shown) defined in the circuit board. Optionally, the floating pins 9' could also be stitched into the contact module 5.

The upper conduit module 41 is assembled along the side of the daughter board 3 and does not take up excessive space. Therefore, the connector assembly 100 has optimal space usage and the space taken by itself has been reduced.

Additionally, any required LEDs 40 could be chosen to work via the appropriate insertion of pins 9, no matter on which portion of the substrate 6 the LEDs 40 are positioned.

It is easy to dispose the LEDs 40 on the substrate 6 and insertion the LEDs 40 into the recesses 54 of the contact module 5. The LED 40 and corresponding conduit 411, 42 are inserted in a same recess 54 and are aligned with each other to get a reliable engagement therebetween.

The upper conduits 411 could be fixed to the connector assembly 100 firmly not only by the insertion of themselves into the openings 13 of the insulative housing 1, but also via the engagement between the connecting beam 412 and the daughter board 3.

However, the disclosure is illustrative only, changes may be made in detail, especially in matter of shape, size, and arrangement of parts within the principles of the invention.

What is claimed is:

1. A connector assembly adapted for being mounted on a circuit board, comprising:
   a jack member;
   a contact module mounted at a bottom of the jack member and defining a plurality of recesses;
   a substrate attached to a bottom of the contact module;
   a plurality of Light Emitting Diodes (LEDs) disposed on the substrate and inserted into the recesses of the contact module;
   an upper conduit module engaged with jack member and having an insertion portion inserted into a corresponding recess of the contact module and aligned with a corresponding LED; and
   an insulative housing defining a plurality of ports and retaining the jack member, the upper conduit module and the contact module together with the LEDs;
   wherein said jack member comprises a vertical daughter board supporting the upper conduit module.

2. The connector assembly as claimed in claim 1, wherein said contact module comprises a plurality of connecting terminals electrically connecting with the daughter board and the circuit board.

3. The connector assembly as claimed in claim 2, wherein said contact module defines a longitudinally extending insertion slot for insertion of a lower edge of the daughter board.

4. The connector assembly as claimed in claim 3, wherein said daughter board has a plurality of electronic components provided at opposite sides thereof and a plurality of conductive pads formed along the lower edge thereof and retained in the insertion slot.

5. The connector assembly as claimed in claim 4, wherein said contact module has a plurality of transversely extending passageways in communication with the insertion slot for insertion of the connecting terminals, each connecting terminal having a contacting end in contact with the conductive pad of the daughter board and a press fit portion connected to the circuit board.

6. The connector assembly as claimed in claim 1, wherein said jack member comprises a plurality of terminal modules assembled to the daughter board, each terminal module having a plurality of mating terminals in electrical communication with the daughter board.

7. The connector assembly as claimed in claim 6, wherein said daughter board is disposed between two adjacent terminal modules and has a plurality of pinholes defined along a front edge thereof for insertion of the mating terminals of the two adjacent terminal modules.

8. The connector assembly as claimed in claim 7, wherein each terminal module comprises a pair of perpendicular plates, and each mating terminal comprises a horizontal portion and an upstanding portion embedded in the pair of plates, a contacting portion retained in the port, and a tail portion inserted into the pinhole.

9. The connector assembly as claimed in claim 6, wherein said upper conduit module comprises a pair of L-shaped conduits extending along opposite sides of the daughter board and a connecting beam connected between the pair of conduits.

10. The connector assembly as claimed in claim 9, wherein said connecting beam has an engaging portion engaging with a cutout defined on the daughter board.

11. The connector assembly as claimed in claim 10, further comprising a plurality of lower conduits fixed in the insulative housing and aligned with a plurality of LEDs provided on the substrate.

12. The connector assembly as claimed in claim 11, wherein each port of the insulative housing defines a pair of openings for insertion of the LEDs.

13. The connector assembly as claimed in claim 1, wherein said substrate has a plurality of mounting holes and conductive circuits each in electrical communication with the mounting hole and corresponding LED.

14. The connector assembly as claimed in claim 13, further comprising a plurality of detachable pins each having one end electrically connected to the conductive circuit and corresponding LEDs and another end electrically connected to the circuit board.

15. The connector assembly as claimed in claim 13, wherein said insulative housing has a plurality of floating pins stitched therein, each floating pin inserting through the mounting hole of the substrate and engaging with a corresponding footprint defined in the circuit board.

16. The connector assembly as claimed in claim 13, wherein said contact module has a plurality of floating pins stitched therein, each floating pin inserting through the mounting hole of the substrate and engaging with a corresponding footprint defined in the circuit board.

* * * * *